United States Patent [19]

Friot

[11] Patent Number: 4,750,088

[45] Date of Patent: Jun. 7, 1988

[54] CARD CAGE

[75] Inventor: Christopher A. Friot, Groton, Mass.

[73] Assignee: Hybricon Corporation, Ayer, Mass.

[21] Appl. No.: 57,219

[22] Filed: Jun. 2, 1987

[51] Int. Cl.[4] ............................................. H05K 7/20
[52] U.S. Cl. ..................................... 361/384; 211/41;
361/383; 361/415
[58] Field of Search ............... 361/382, 383, 384, 385,
361/399, 415; 211/41

[56] References Cited

U.S. PATENT DOCUMENTS

| | | | |
|---|---|---|---|
| 3,675,299 | 7/1972 | Sherill | 361/415 X |
| 4,164,362 | 8/1979 | Cobaugh et al. | 361/415 X |
| 4,201,303 | 5/1980 | Smith | 361/415 X |
| 4,277,815 | 7/1981 | Skroupa | 361/415 X |
| 4,323,161 | 4/1982 | Marconi | 361/415 X |
| 4,327,835 | 5/1982 | Leger | 361/415 X |
| 4,328,897 | 5/1982 | Weiss | 361/415 X |
| 4,353,469 | 10/1982 | Etchison et al. | 361/415 X |
| 4,417,295 | 11/1983 | Stuckert | 361/415 X |
| 4,429,937 | 2/1984 | Stockmaster | 361/415 X |
| 4,502,100 | 2/1985 | Greenspan et al. | 361/415 X |

FOREIGN PATENT DOCUMENTS 230972  1/1964  Austria ................................. 361/415

*Primary Examiner*—R. R. Kucia
*Attorney, Agent, or Firm*—Schiller, Pandiscio & Kusmer

[57] ABSTRACT

A card cage for holding a plurality of printed circuit boards has aerodynamically designed card guides and air deflectors that are configured to direct air flow across components mounted on the printed circuit boards. The card cage has a substantially rectangular frame formed by a pair of side panels, a pair of upper cross members and a pair of lower cross members. A pair of upper card guides are mounted between the upper cross members and a pair of lower card guides are mounted between the lower cross members, the card guides being captively held in parallel relationship to the side panels. The inner facing surface of each card guide is provided with a U-shaped channel that is sized and shaped to slidably receive a printed circuit card. The sidewalls of each card guide taper inwardly from the inner facing surface to the outer facing surface to form a streamlined structure with a narrow head at the outer surface that provides minimum resistance to air flow through the card cage. The air deflectors are mounted at the ends of the frame in perpendicular relationship to the card guides. Each air deflector has a substantially wedge-shaped profile in right cross section that deflects external cooling air into the marginal areas of the printed circuit boards.

21 Claims, 3 Drawing Sheets

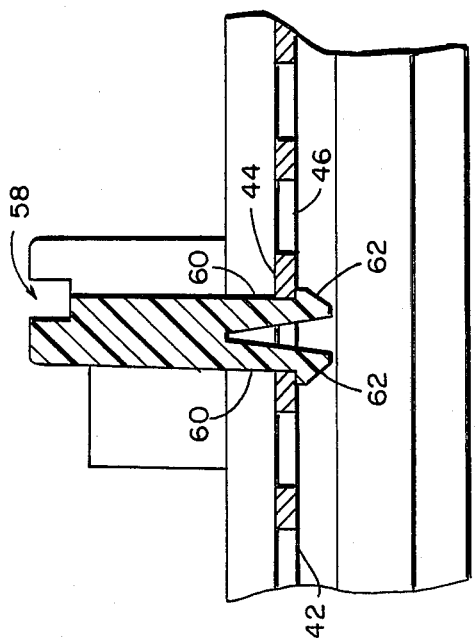
FIG. 3
FIG. 4
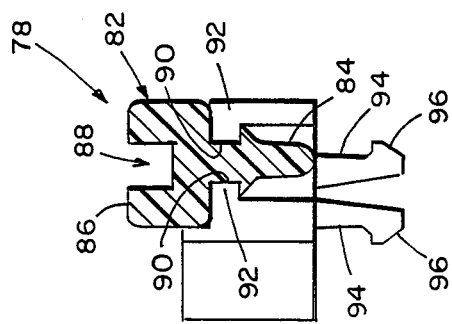
FIG. 7
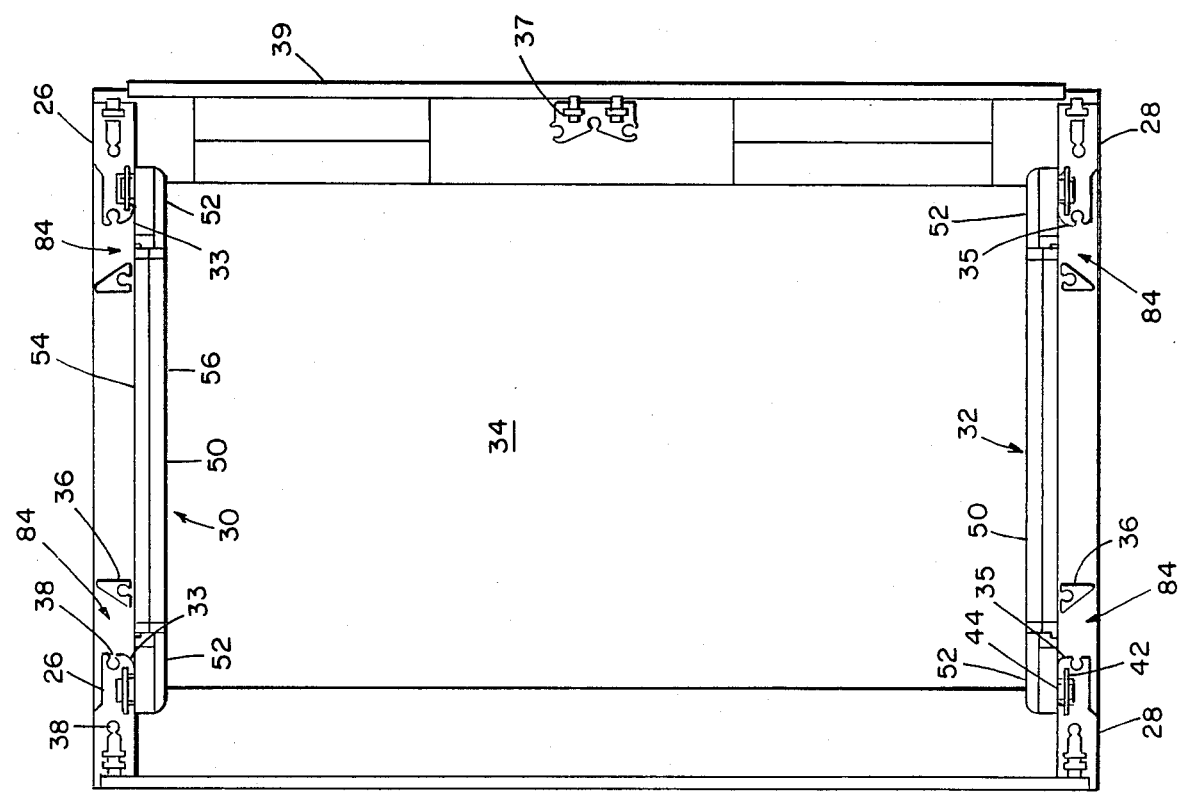
FIG. 2

CARD CAGE

BACKGROUND OF THE INVENTION

1. Field of the Invention

The present invention relates to devices for mounting printed circuit boards and, more particularly, is directed towards card cages.

2. Description of the Prior Art

Card cages have been designed for mounting and interconnecting a plurality of printed circuit boards. The card cage is a substantially rectangular structure having upper and lower card guide pairs, each pair designed to mount one circuit board. Each card guide has a channel that is configured to receive one edge of a printed circuit board, the boards being mounted side-by-side. Due to the closeness of the mounted circuit boards, the card guides must be relatively rigid to prevent the boards from moving and touching each other. Large card guide structures hamper air flow across the components on the circuit board and prevent full utilization of the circuit boards. Attempts to decrease the cross-sectional area of the card guides in order to provide increased air flow have been met with limited success due to the increased flexibility resulting from the decrease in cross-sectional area and structural strength of the card guide. Such flexibility has resulted in the circuit boards touching. A need has arisen for an improved card cage that provides increased air flow across the circuit boards and permits full utilization of usable circuit board surfaces.

SUMMARY OF THE INVENTION

It is an object of the present invention to provide a card cage that is configured to maximize air flow across circuit boards mounted in the card cage.

It is another object of the present invention to provide a card cage that is configured to provide increased air flow across the marginal sections of circuit boards mounted in the card cage in order to allow for full utilization of usable circuit board surfaces.

A further object of the present invention is to provide a printed circuit board card cage with aerodynamically designed card guides and air deflectors that are configured to direct air across the circuit cards. The air deflectors direct air to the components mounted at the marginal areas of the printed circuit card and the card guides are configured to facilitate flow of air across the components mounted in other areas of the printed circuit card. The card cage is a substantially rectangular frame formed by a pair of side panels that are held apart by upper and lower cross members. Apertured spacer bars are carried in grooves formed in each of the cross members. Upper and lower card guides are captively held to the spacer bars, the card guides being held in parallel relationship to the panels. Each card guide has a relatively wide inner facing surface and a relatively narrow outer facing surface. The inner facing surface of each card guide is provided with a substantially U-shaped channel that is sized to slidably receive a printed circuit card, one card being held in the facing channels of an upper and lower card guide pair. The channel sidewalls of each card guide taper inwardly from the wide inner facing channel surface to the narrow outer facing surface to form an aerodynamically streamlined structure that reduces resistance to air flow through the card cage and across the circuit board components. The air deflectors are mounted at the ends of the rectangular frame in perpendicular relationship to the card guides. Each air deflector has a substantially wedge-shaped profile in right cross section that deflects the external cooling air across components mounted in the marginal areas of the printed circuit boards.

Other objects of the present invention will in part be obvious and will in part appear hereinafter.

The invention accordingly comprises the apparatus together with its parts, elements and interrelationships that are exemplified in the following disclosure, the scope of which will be indicated in the appended claims.

BRIEF DESCRIPTION OF THE DRAWINGS

A fuller understanding of the nature and objects of the present invention will become apparent upon consideration of the following detailed description taken in connection with the accompanying drawings, wherein:

FIG. 2 is a cross-sectional view taken along the line 2—2 of FIG. 1;

FIG. 3 is a cross-sectional view taken along the line 3—3 in FIG. 1;

FIG. 4 is a cross-sectional view taken along the line 4—4 in FIG. 1;

FIG. 7 is a cross-sectional view taken along the line 7—7 in FIG. 6; and

DETAILED DESCRIPTION OF THE PREFERRED EMBODIMENTS

Figure 1:
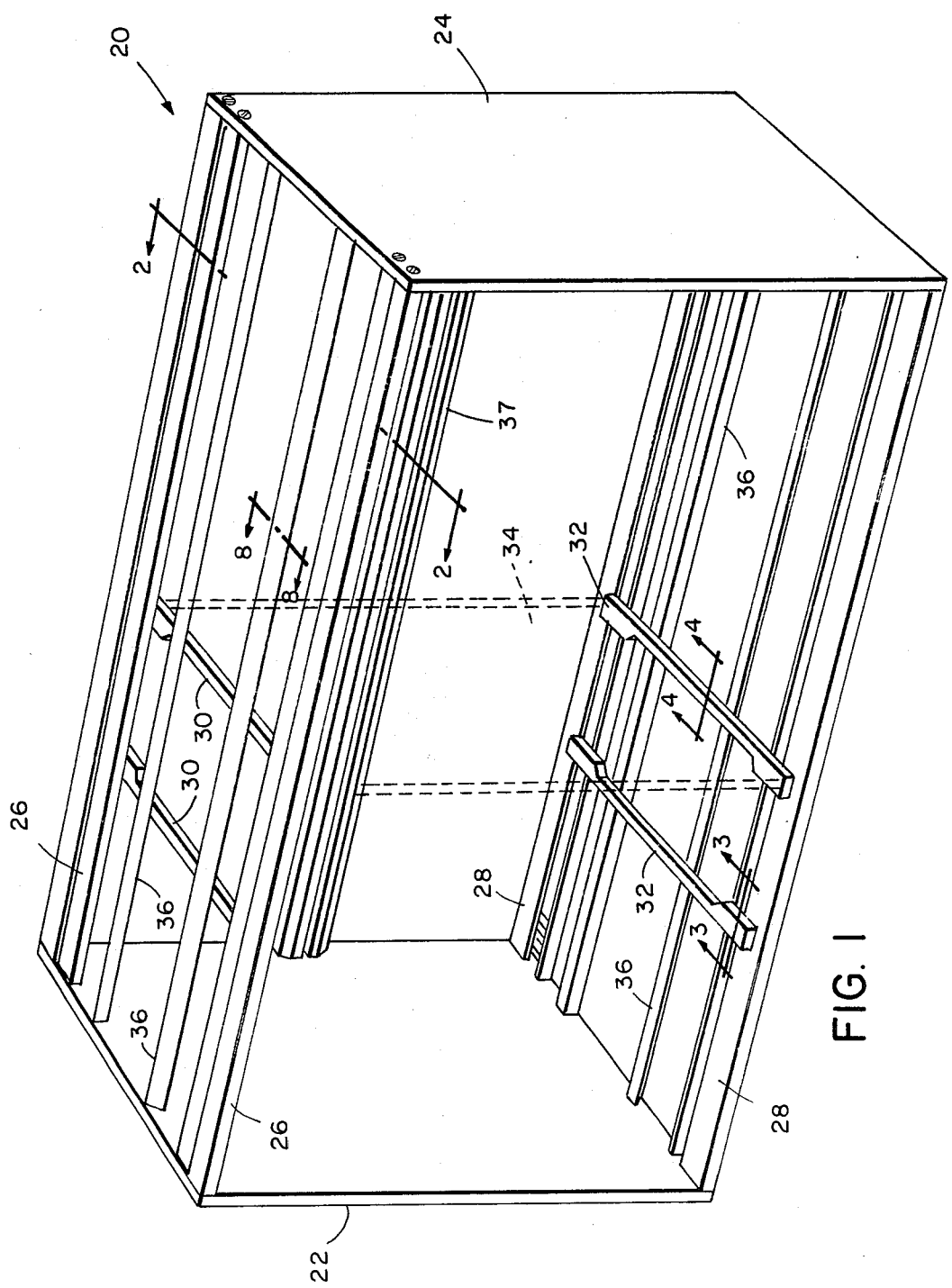
FIG. 1 is a perspective view of a card cage embodying the present invention.

Referring now to the drawings, particularly FIG. 1, there is shown a card cage 20 embodying the present invention. Card cage 20 is a substantially rectangular frame that is formed by interconnecting a pair of opposing panels 22, 24 by means of upper cross members 26 and lower cross members 28. A plurality of upper card guides 30 are captively held in upper cross members 26 and a plurality of lower card guides 32 are captively held in lower cross members 28. As hereinafter described, a circuit board 34 is held between one of the upper card guides 30 and one of the lower card guide 32, the card guides being designed to minimize resistance to air flow through the card cage. Air deflectors 36, which are mounted between the panels 22, 24, cooperate with the sloped inner surface 33 of upper cross members 26 and the sloped inner surface 35 of lower cross members 28 to direct air across components mounted in the end sections of the circuit boards. A back plane bracket 37 is mounted between panels 22 and 24. A back plane 39, which is mounted to bracket 37, is provided for interconnecting the circuit boards 34 that are mounted in the card cage 20.

The panels 22 and 24 are held in spaced parallel relationship by the upper and lower cross members 26 and 28, respectively. In the preferred embodiment, upper cross members 26 and lower cross members 28 are extruded members, each member having a longitudinally extending holes 38 that are sized to receive a self-tapping screws 40. The panels 22 and 24 are held to the ends of the upper and lower cross members 26 and 28 by screws 40. Each upper and lower cross member 26 and 28 is formed also with a longitudinally extending guideway 42 that is configured to receive a spacer bar 44 having a series of evenly spaced apertures or sockets 46. The upper card guides 30 and the lower card guides 32 are captively held in the apertures 46 of the spacer bars 44 that are received in the guideways 42 of the upper cross members 26 and lower cross members 28, respectively.

Each card guide 30 and 32 includes an elongated body 50 and integral end connectors 52. As best shown in FIG. 4, body 50 has a substantially Y-shaped profile in right cross section with a narrow head 54 and a wide base 56. The narrow head 54 faces toward the exterior of the card cage 20 and the wide base 56 faces the interior of the card cage. Accordingly, each card guide 30 and 32 has a streamline body that provides minimum resistance to air flow and increased cooling to components mounted on the circuit boards 34. The Y-shaped profile provides sufficient strength to prevent unwanted flexing of the card guides and full utilization of the circuit boards. In the preferred embodiment, the card guides are composed of a glass-filled nylon, the height of the card guides providing sufficient stiffness to prevent flexing of the card guide. The wide base 56 is formed with a substantially U-shaped, longitudinally extending channel or track 58 that is sized and shaped to slidably receive the edge of a circuit board 34.

As shown in FIG. 3, each end connector 52 has a pair of tabs 60 which extend beyond the narrow head 52. The end 62 of each tab 60 is enlarged and wedge-shaped to form a locking member, each pair of tabs 60 being configured to snugly fit into locking engagement with one of the sockets 46 of spacer bars 44. When the tabs are pushed fully into socket 46, enlarged end 62 is locked in the socket. The upper card guides 30 and the lower card guides 32 are securely fastened to the upper cross members 26 and lower cross members 28, respectively, when the tabs 60 are locked in the sockets 46. One upper card guide 30 is in registration with one lower card guide 32, the two card guides defining a card guide pair that is configured to mount one circuit board 34. The tracks 58 of each card guide pair face one another and form a channel for holding one circuit board 34. As hereinafter described, the tabs 60, which are configured to lock into the sockets 46 of the spacer bars 44, are offset from track 58 so as to provide variable spacing of adjacent circuit boards 34. That is, track 58 lies along a line that is parallel to and offset from a line drawn between corresponding tabs 60 of connectors 52 at opposite ends of body 50. In an alternate embodiment, the card guides are not an integral piece, but rather a multi-piece.

Figure 6:
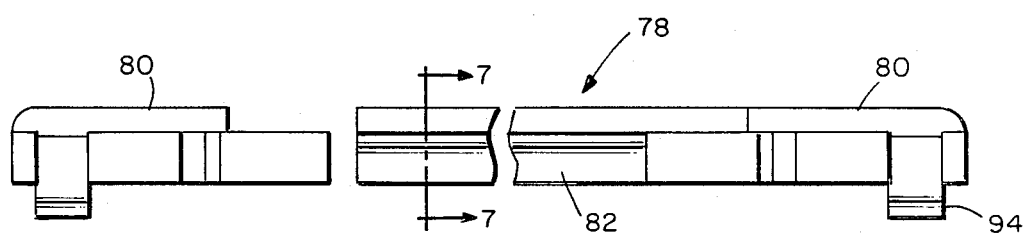
FIG. 6 is an alternate embodiment of the card guide shown in FIG. 1.

Referring now to FIGS. 6 and 7, there is shown an alternate embodiment in which each card guide is a three-piece member 78 having a pair of end connector pieces 80 and an elongated body 82. Preferably, elongated body 82 is an extruded member having a generally Y-shaped member having a narrow head 84 and a wide base 86 that is formed with a substantially U-shaped, longitudinally extending channel or track 88. A pair of U-shaped side channels 90, which extend longitudinally along opposite sides of body 82, are sized and shaped to receive a pair of L-shaped grips 92 formed in end pieces 80. Each end piece 80 has a pair of tabs 94 that project outwardly of the end piece. Each tab 94 has an enlarged wedge-shaped head 96 that is configured to lock into apertures 46 of spacer bars 44 in a similar manner to that previously described in connection with tabs 60. As best shown in FIG. 7, tabs 92 are offset from track 86 to provide variable spacing between adjacent circuit boards 34. That is, track 86 lies along a line which is offset from and parallel to a line drawn between tabs 92 at opposite ends of card guide 78. As previously discussed in connection with FIG. 3, channel 58 and tabs 60 are offset to provide variable spacing between adjacent circuit boards.

Figure 5:
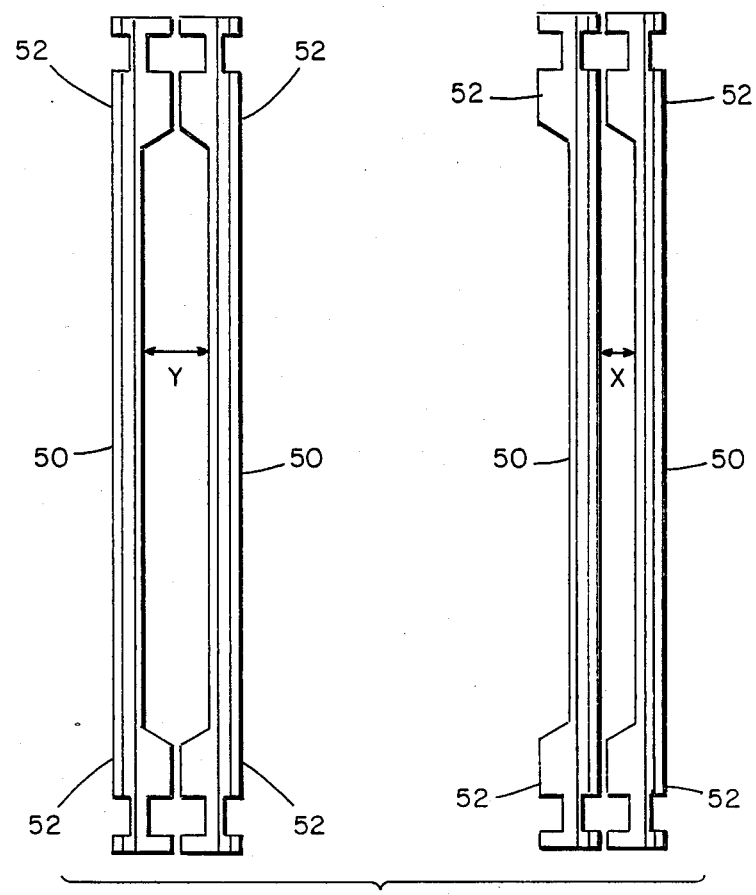
FIG. 5 is a top plan view showing various card guide mounting configurations.

Referring now to FIG. 5, it will be seen that the bodies 50 of adjacent left-hand card guides are separated by a distance denoted by X when the adjacent card guides are mounted in the same manner. The bodies 50 of adjacent right-hand card guides, as view in FIG. 5, are separated by a distance denoted by Y when one of the adjacent card guides is rotated 180°. That is, in the left-hand pair of card guides, corresponding ends of the card guides are mounted to the same cross member. In the right-hand pair of card guides, one end of one of the card guides is mounted to one of the cross members and the corresponding end of the other card guide is mounted to the other cross member. The distance denoted by Y is greater than the distance denoted by X. As previously indicated, in addition to providing variable spacing, the card guides 30 and 32 are designed to prevent unwanted flexing of the card guides. Also, the streamlined contour of the card guides 30 and 32 reduces resistance to air flowing into the card cage and across the components mounted on the circuit boards 34 secured to the card guide pairs even though the circuit boards may be mounted close together. Air deflectors 36 direct flowing air to components mounted on the ends of the circuit boards 34.

Figure 8:
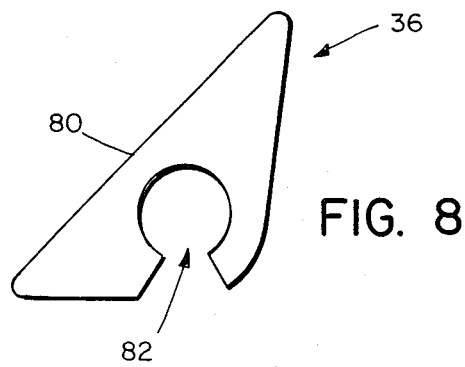
FIG. 8 is a cross-sectional view of the air deflector taken along the line 8—8 in FIG. 1.

As best shown in FIG. 8, air deflectors 36 are extruded members having a substantially wedge-shaped profile in right cross section. Each air deflector 36 is provided with a sloped surface 80 that deflects air and a longitudinally extending hole 82 that is configured to receive a self-tapping screw 40. The air deflectors 36, which are mounted between panels 22 and 24, are secured thereto by screws 40. In the illustrated embodiment, by way of example, there are four air deflectors 36, one deflector mounted beside and parallel to one cross member. The air deflectors 36 are positioned to cooperate with the inner sloped surface 33 of upper cross members 26 and the inner sloped surface 35 of lower cross members 28 to form a channel 84 for directing air into the marginal areas of the circuit boards 34. As best shown in FIG. 2, channel 84 is formed between each inner surface 33 and the sloped surface 80, and between each inner surface 35 and the sloped surface 80. Channel 84 enhances airflow to the components mounted in the marginal areas of the circuit boards.

Since certain changes may be made in the foregoing disclosure without departing from the invention herein involved, it is intended that all matter contained in the above description and depicted in the accompanying drawings be construed in an illustrative and not in a limiting sense.

What is claimed is:

1. A printed circuit card cage for holding a plurality of printed circuit cards having components mounted thereon, said card cage comprising:
   (a) a frame having a pair of panels and a plurality of upper and lower cross members that are interconnected to form a substantially rectangular structure, said upper and lower cross members substantially perpendicular to said panels;

(b) upper and lower card guides mounted to said upper and lower cross members, respectively, said upper and lower card guides mounted in substantially spaced parallel relationship with said panels, each said upper and lower card guide having a substantially Y-shaped profile in right cross section with a wide base and a narrow head, said base facing the interior of said frame and said head facing outwardly of said frame;

(c) the surface of each said card guide intermediate its ends that faces the interior of said frame is formed with a longitudinal channel that is sized and shaped to slidably receive the edge of a printed circuit card; and (d) at least one air deflector mounted to said frame in spaced parallel relationship with said cross members, each said air deflector having a contoured surface that deflects external cooling air into the marginal areas at the end sections of the cards.

2. The card cage as claimed in claim 1 wherein each said cross member includes bracket means for captively holding said upper and lower card guides.

3. The card cage as claimed in claim 1 wherein each said upper and lower card guides includes mounting means at its ends, said mounting means configured to interlock with said cross members.

4. The card cage as claimed in claim 3 wherein said mounting means extends outwardly from said outer facing surface of each said upper and lower card guide, said mounting means offset from said channel.

5. The card cage as claimed in claim 4 wherein adjacent ones of said card guides are spaced apart a first distance when said mounting means at one end of one of said card guides is captively held in said bracket means at one side of said frame and said mounting means at the other end of said card guide is captively held in said bracket means at the other side of said frame, adjacent ones of said card guides are spaced apart a second distance when said mounting means at said other side of said one card guide is captively held in said bracket means at said one side of said frame and said mounting means at said one side of said one card guide is captively held in said bracket means at said other side of said frame, said first distance being greater than said second distance.

6. The card cage as claimed in claim 1 wherein each said bracket means includes a series of evenly spaced openings, each said opening sized to captively hold one of said mounting means of said guides.

7. The card cage as claimed in claim 6 wherein each said mounting means includes first mounting means at one end of each said card guide and second mounting means at an opposite end, of said card guide, said first mounting means in alignment with said second mounting means, said channel in parallel relationship with and offset from an imaginary line connecting said first and second mounting means.

8. The card cage as claimed in claim 7 wherein adjacent ones of said card guides are spaced apart a first distance when said first mounting means is at one side of the card cage and said second mounting means is at an opposite side of the card cage, adjacent ones of said card guides are spaced apart a second distance when said second mounting means is at said one side of the card cage and said first mounting means is at said opposite side of the card cage, said first distance being greater than said second distance.

9. A printed circuit card cage for holding a plurality of printed circuit cards having components mounted thereon, said card cage comprising:

(a) a frame having a pair of panels and a plurality of upper and lower cross members, said panels and cross members interconnected to form a substantially rectangular structure with the panels facing each other, said upper and lower cross members substantially perpendicular to said panels;

(b) upper and lower card guides mounted to said upper and lower cross members, respectively, one of each said upper guides in registration with one of each said lower card guides and defining a card guide pair, said upper and lower card guides mounted in substantially spaced parallel relationship with said panels, each said upper and lower card guide having a substantially Y-shaped profile in right cross section with a wide base and a narrow head, said base facing the interior of said frame and said head facing outwardly;

(c) the surface of each said card guide intermediate its ends that faces the interior of said frame is formed with a longitudinal track that is sized and shaped to slidably receive a printed circuit card, said tracks of each said card guide pair configured to hold one printed circuit card; and (d) at least one air deflector mounted to said frame in spaced parallel relationship with said cross members, said air deflector having a contoured surface that deflects external cooling air into the marginal area at the end section of the card cage.

10. The card cage as claimed in claim 9 wherein each said cross member includes an apertured plate for captively holding said upper and lower card guides.

11. The card cage as claimed in claim 10 wherein each said upper and lower card guides includes tabs at opposite ends thereof, said tabs extend outwardly from said outer facing surface of each said upper and lower card guide.

12. The card cage as claimed in claim 11 wherein adjacent ones of said card guides are spaced apart a first distance when said tabs at one end of one of said card guides is captively held in said apertured plated at one side of said frame and said tabs at the other end of said guide is captively held in said apertured plate at the other side of said frame, adjacent ones of said card guides are spaced apart a second distance when said tabs at said other side of said one card guide is captively held in said apertured plate at said one side of said frame and said tabs at said one side of said one card guide is captively held in said apertured plate at said other side of said frame, said first distance being greater than said second distance.

13. The card cage as claimed in claim 12 wherein each said aperture plate includes a series of evenly spaced openings, each said opening sized to captively hold one of said tabs of said card guides.

14. The card cage as claimed in claim 9 wherein each said mounting means includes first mounting means at one end of said card guide and second mounting means at an opposite end of said card guide, said first mounting means in alignment with said second mounting means, said track in parallel relationship with and offset from an imaginary line connecting said first and second mounting means.

15. The card cage as claimed in claim 14 wherein adjacent ones of said card guides are spaced apart a first distance when said first mounting means is at one side of the card cage and said second mounting means is at an opposite side of the card cage, adjacent ones of said card guides are spaced apart a second distance when said second mounting means is at said one side of the card cage and said first mounting means is at said opposite side of the card cage, said first distance being greater than said second distance.

16. A printed circuit card cage for holding a plurality of printed circuit cards having components mounted thereon, said cage comprising:
(a) a frame having panels, upper cross members and lower cross members that are interconnected to form a substantially rectangular structure, said upper and lower cross members substantially perpendicular to said panels, an inner surface of said upper and lower cross members being sloped;,
(b) upper and lower card guides mounted to said upper and lower cross members, respectively, said upper and lower card guides mounted in substantially spaced parallel relationship with said panels, each said upper and lower sidewall having a substantially Y-shaped profile in right cross section with a wide base and a narrow head, said base facing the interior of said frame and said head facing outwardly;
(c) the surface of each said guide intermediate its ends which faces the interior of said frame is formed with a longitudinal track that is sized and shaped to slidably receive a printed circuit card, a track of one said upper card guides in spaced registration with a track of one of said lower card guides to form a card guide pair, one printed circuit board mountable in said tracks of each said card guide pair, the circuit board mounted in spaced parallel relationship with said panels;
(d) a plurality of air deflectors mounted to said frame in spaced parallel relationship with said cross members, each said air deflector having a contoured surface that cooperates with said sloped inner surface of each said upper and lower cross member and forms a channel that directs external cooling air into the marginal areas at the end sections of the card cage and across the marginal areas of circuit boards mounted in the card cage.

17. The card cage as claimed in claim 16 wherein each said upper and lower card guides includes mounting means at opposite ends thereof, said mounting means extending outwardly from said outer facing surface of each said upper and lower card guide.

18. The card cage as claimed in claim 17 wherein each said cross member is formed with a guideway, an apertured strip received in each said guideway, said apertured strip having a series of evenly spaced openings, each said opening sized to captively hold one of said mounting means of said guides.

19. The card cage as claimed in claim 18 wherein each said mounting means includes first mounting means at one end of said card guide and second mounting means at an opposite end of said card guide, said first mounting means in alignment with said second mounting means, a longitudinal axis of any one card guide being parallel to and offset from an imaginary line connecting said first and second mounting means of said any one card guide.

20. The card cage as claimed in claim 19 wherein adjacent ones of said card guides are spaced apart a first distance when said first mounting means is at one side of the card cage and said second mounting means is at an opposite side of the card cage, adjacent ones of said card guides are spaced apart a second distance when said second mounting means is at said one side of the card cage and said first mounting means is at said opposite side of the card cage, said first distance being greater than said second distance.

21. A printed circuit card cage for holding a plurality of printed circuit cards having components mounted thereon, said card cage comprising:
(a) a frame having a pair of panels and a plurality of upper and lower cross members that are interconnected to form a substantially rectangular structure, said upper and lower cross members substantially perpendicular to said panels; and
(b) upper and lower card guides mounted to said upper and lower cross members, respectively, said upper and lower guides mounted in substantially spaced parallel relationship with said panels, each said upper and lower card guide having a substantially Y-shaped profile in right cross section with a wide base and a narrow head, said wide base facing the interior of said frame and said narrow head facing outwardly of said frame;
(c) each said upper and lower card guides including mounting means at opposite ends, said mounting means configured to interlock with said cross members;
(d) the surface of each said card guide intermediate its ends that faces the interior of said frame is formed with a longitudinal channel that is sized and shaped to slidably receive the edge of a printed circuit card;
(e) each said mounting means extends outwardly from said outer facing surface of each said upper and lower card guide, said mounting means offset from said channel, whereby adjacent ones of said card guides are spaced apart a first distance when said mounting means at one end of one of said card guides is captively held in said bracket means at one side of said frame and said mounting means at the other end of said card guide is captively held in said bracket means at the other side of said frame, adjacent ones of said card guides are spaced apart a second distance when said mounting means at said other side of said one card guide is captively held in said bracket means at said one side of said frame and said mounting means at said one side of said one card guide is captively held in said bracket means at said other side of said frame, said first distance being greater than said second distance.

* * * * *